United States Patent
Kurczveil et al.

(10) Patent No.: US 10,396,521 B2
(45) Date of Patent: Aug. 27, 2019

(54) LASER

(71) Applicant: HEWLETT PACKARD ENTERPRISE DEVELOPMENT LP, Houston, TX (US)

(72) Inventors: Geza Kurczveil, Palo Alto, CA (US); Raymond G. Beausoleil, Palo Alto, CA (US); Di Liang, Santa Barbara, CA (US); Chong Zhang, Palo Alto, CA (US); David Kielpinski, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/720,493

(22) Filed: Sep. 29, 2017

(65) Prior Publication Data
US 2019/0103719 A1 Apr. 4, 2019

(51) Int. Cl.
| | |
|---|---|
| *H01S 3/10* | (2006.01) |
| *H01S 5/06* | (2006.01) |
| *H01S 5/12* | (2006.01) |
| *H01S 3/098* | (2006.01) |
| *H01S 3/13* | (2006.01) |
| *H01S 3/30* | (2006.01) |
| *H01S 3/00* | (2006.01) |
| *H01S 5/10* | (2006.01) |

(52) U.S. Cl.
CPC ........ *H01S 3/0057* (2013.01); *H01S 3/10007* (2013.01); *H01S 5/0601* (2013.01); *H01S 5/1092* (2013.01); *H01S 5/1221* (2013.01)

(58) Field of Classification Search
CPC .. H01S 3/10007; H01S 5/0601; H01S 5/1092; H01S 5/1221

USPC .......................................................... 372/25, 6
See application file for complete search history.

(56) References Cited

U.S. PATENT DOCUMENTS

| | | |
|---|---|---|
| 5,757,027 A | 5/1998 | Kuchta |
| 6,040,590 A | 3/2000 | Obrien et al. |
| 6,085,237 A | 7/2000 | Durham et al. |
| 6,487,354 B1 | 11/2002 | Ferm et al. |
| 6,704,792 B1 | 3/2004 | Oswald |
| 6,734,105 B2 | 5/2004 | Kim |
| 6,774,448 B1 | 8/2004 | Lindemann et al. |
| 6,902,987 B1 | 6/2005 | Tong et al. |

(Continued)

FOREIGN PATENT DOCUMENTS

| | | |
|---|---|---|
| CN | 103843210 A | 6/2014 |
| KR | 10-2000-0055239 A | 9/2000 |

(Continued)

OTHER PUBLICATIONS

G, C. et al., "Optimization of Filtering Schemes for Broadband Astro-combs," (Research Paper), 2012, 2 pages, https://www.ncbi.nlm.nih.gov/pubmed/23187265.

(Continued)

*Primary Examiner* — Tuan N Nguyen
(74) *Attorney, Agent, or Firm* — Hewlett Packard Enterprise Patent Department

(57) ABSTRACT

A laser includes a traveling wave laser cavity with an active section, a pulse stretcher, and a pulse compressor. The pulse stretcher is coupled to the waveguide before the active section and the pulse compressor is coupled to the waveguide after the active section.

19 Claims, 5 Drawing Sheets

(56) References Cited

U.S. PATENT DOCUMENTS

| | | |
|---|---|---|
| 7,244,679 B2 | 7/2007 | Koh |
| 7,257,283 B1 | 8/2007 | Liu et al. |
| 7,561,605 B1 | 7/2009 | Delfyett et al. |
| 7,565,084 B1 | 7/2009 | Wach |
| 7,627,018 B1 | 12/2009 | Guilfoyle et al. |
| 7,653,106 B2 | 1/2010 | Arimoto |
| 7,873,992 B1 | 1/2011 | Daily et al. |
| 7,935,956 B2 | 5/2011 | Xie |
| 8,110,823 B2 | 2/2012 | Bowers |
| 9,065,572 B1 | 6/2015 | Wach |
| 9,110,219 B1 | 8/2015 | Zhang et al. |
| 9,166,363 B2 | 10/2015 | Jain |
| 9,343,874 B2 | 5/2016 | Liu et al. |
| 9,450,379 B2 | 9/2016 | Zhang et al. |
| 9,494,734 B1 | 11/2016 | Jain et al. |
| 2003/0081642 A1 | 5/2003 | Hwang et al. |
| 2003/0086635 A1 | 5/2003 | Bylsma et al. |
| 2004/0037342 A1 | 2/2004 | Blauvelt et al. |
| 2004/0114641 A1* | 6/2004 | Wise ............... H01S 3/06791 372/6 |
| 2004/0247005 A1 | 12/2004 | Schrodinger et al. |
| 2006/0039424 A1 | 2/2006 | Thoma et al. |
| 2007/0133632 A1* | 6/2007 | Doerr ............... H01S 5/026 372/30 |
| 2007/0170417 A1 | 7/2007 | Bowers |
| 2008/0002929 A1 | 1/2008 | Bowers et al. |
| 2008/0049802 A1 | 2/2008 | Kim et al. |
| 2009/0154517 A1 | 6/2009 | Leem et al. |
| 2009/0245298 A1 | 10/2009 | Sysak et al. |
| 2009/0245316 A1 | 10/2009 | Sysak et al. |
| 2009/0274411 A1 | 11/2009 | Bar et al. |
| 2010/0111128 A1 | 5/2010 | Qin et al. |
| 2010/0142973 A1 | 6/2010 | Gubenko et al. |
| 2011/0080090 A1 | 4/2011 | Wood et al. |
| 2011/0134939 A1 | 6/2011 | Zhang |
| 2011/0163421 A1 | 7/2011 | Mi |
| 2011/0299561 A1 | 12/2011 | Akiyama |
| 2012/0008658 A1 | 1/2012 | Chung |
| 2012/0063484 A1 | 3/2012 | Goddard et al. |
| 2012/0093456 A1 | 4/2012 | Taillaert et al. |
| 2012/0189317 A1 | 7/2012 | Heck et al. |
| 2012/0205352 A1 | 8/2012 | Fermann |
| 2012/0300796 A1 | 11/2012 | Sysak et al. |
| 2012/0320939 A1 | 12/2012 | Baets et al. |
| 2013/0107901 A1 | 5/2013 | Deppe |
| 2013/0143336 A1 | 6/2013 | Jain |
| 2013/0182730 A1 | 7/2013 | Fan et al. |
| 2014/0264031 A1 | 9/2014 | Fermann et al. |
| 2014/0363127 A1 | 12/2014 | Baets et al. |
| 2015/0111325 A1 | 4/2015 | Hsu et al. |
| 2015/0139264 A1 | 5/2015 | Zhang et al. |
| 2015/0177458 A1 | 6/2015 | Bowers et al. |
| 2015/0333480 A1 | 11/2015 | Santis et al. |
| 2016/0276807 A1 | 9/2016 | Cai et al. |
| 2016/0356960 A1 | 12/2016 | Novack et al. |
| 2017/0187161 A1 | 6/2017 | Fermann et al. |
| 2017/0207600 A1 | 7/2017 | Klamkin et al. |
| 2018/0026830 A1 | 1/2018 | Bhatia et al. |
| 2018/0191134 A1 | 7/2018 | Osinski et al. |

FOREIGN PATENT DOCUMENTS

| | | |
|---|---|---|
| KR | 10-2015-0097306 A | 8/2015 |
| WO | 2016/011002 A1 | 1/2016 |
| WO | 2016/018285 A1 | 2/2016 |

OTHER PUBLICATIONS

Zhu et al., Ultrabroadband flat dispersion tailoring of dual-slot silicon waveguides, Optics Express, vol. 20, Issue 14, 2012, pp. 15899-15907.

Zhang et al., "Silicon waveguide with four zero-dispersion wavelengths and its application in on-chip octave-spanning supercontinuum generation", Optics Express, vol. 20, Issue 2, 2012, pp. 1685-1690.

Waylin J. Wing et al., "Improvement of Plasmonic Enhancement of Quantum Dot Emission via an Intermediate Silicon-aluminum Oxide Interface," Applied Physics Letters 106, 2015, pp. 013105-1-013105-4, AIP Publishing LLC.

Wang T., "High-Performance III-V Quantum-Dot Lasers Monolithically Grown on Si and Ge Substrates for Si Photonics," (Research Paper), University College of London, 2012, 1 pages, available at http://ethos.bl.uk/OrderDetails.do?uin=uk.bl.ethos.568246.

Tang, M. et al., "Direct Integration of Quantum Dot Lasers on Silicon," (Research Paper), 18th European Conference on Integrated Optiics 2016, May 18-20, 2016, 2 pages, available at http://www.ecio-conferenee.org/wp-content/uploads/2016/06/EC10-1-04. pdf.

Tan et al., "Monolithic nonlinear pulse compressor on a silicon chip", Nature Communications, vol. 116, 2010, 6 pages.

Resan et al., "Dispersion-managed breathing-mode semiconductor mode-locked ring laser: experimental characterization and numerical simulations", IEEE Journal of Quantum Electronics, vol. 40, Issue 3, Mar. 2004, pp. 214-221.

Liu et aL, "Quantum Dot Lasers for Silicon Photonics" Photon. Res., vol. 3, No. 5, Oct. 2015, pp. B1-B9.

Katsuaki Tanabe et al., "High-Temperature 1.3 InAS/GaAs Quantum Dot Lasers on Si Substrates Fabricated by Wafer Bonding," Applied Physics Express 6, Published on Jul. 25, 2013, pp. 082703-1-082703-4, The Japan Society of Applied Physics.

"SnmpSharpNet", SNMP Library for C#, Project Updates, available online at <http://www.snmpsharpnet.com/?page_id=160&paged=2>, retrieved on Jun. 13, 2018, 8 pages.

Moskalenko et al., "A Wide Bandwidth Coherent Optical Comb Source Based on a Monolithically Integrated Mode-Locked Ring Laser", Optical Fiber Communication Conference, Mar. 2014, 3 pages.

International Search Report and Written Opinion received for PCT Patent Application No. PCT/US18/53664, dated Feb. 28, 2019, 12 pages.

Delfyett et al., "Chirped pulse laser sources and applications", Progress in Quantum Electronics, vol. 36, Nov. 3, 2012, pp. 475-540.

* cited by examiner

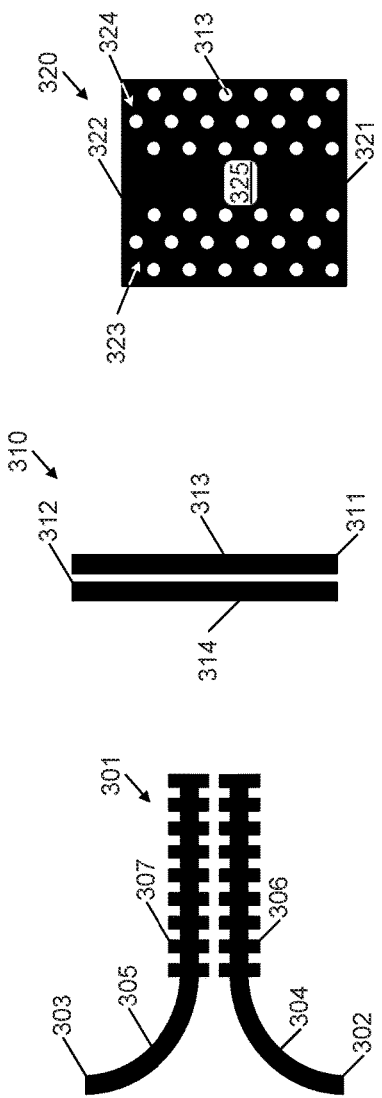
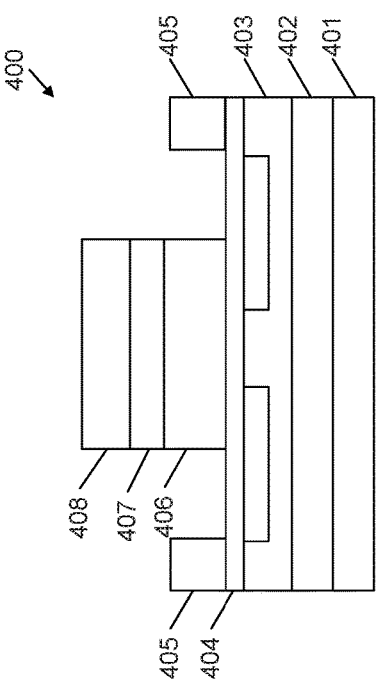

LASER

STATEMENT OF GOVERNMENT INTEREST

This invention was made with government support under Contract No. H98230-12-C-0236, awarded by Maryland Procurement Office. The government has certain rights in the invention.

BACKGROUND

A comb laser is a laser sources whose spectrum comprises a set of discrete equally spaced wavelengths. Semiconductor lasers based on quantum dot (QD) gain material are attractive candidates for multi-wavelength comb lasers due to their low relative intensity noise compared to quantum well-based lasers.

BRIEF DESCRIPTION OF THE DRAWINGS

Certain examples are described in the following detailed description and in reference to the drawings, in which:

FIG. 3A illustrates an example waveguide Bragg grating;
FIG. 3B illustrates an example horizontal slot waveguide;
FIG. 3C illustrates an example photonic crystal waveguide;
FIG. 4 illustrates an example portion of an active section of a laser.

DETAILED DESCRIPTION OF SPECIFIC EXAMPLES

Semiconductor comb lasers are attractive light sources for optical wavelength division multiplex (WDM) communication technologies. For such applications, wider comb widths (i.e., more wavelengths) and higher power are generally desired. However, laser gain materials such as quantum dots can introduce unwanted nonlinearities at higher powers that prevent modelocking.

Examples disclosed herein provide multi-wavelength semiconductor lasers fabricated using silicon-on-insulator (SOI) substrates. The example multi-wavelength semiconductor lasers disclosed herein provide high performance and low amplitude noise while being capable of being integrated in high volumes at low cost. Moreover, the example multi-wavelength semiconductor lasers disclosed herein are capable of being integrated with high-quality passive silicon components, such as grating couplers, power splitters, multiplexers/de-multiplexers, SiGe and InGaAs photodetectors, etc., on a single chip in high volume at low cost.

The described technology includes a pulse stretcher located within comb laser cavity prior to the active region and a pulse compressor within the cavity prior to a laser output. The pulse stretcher may reduce peak pulse power by stretching the pulse in the time domain. This may reduce the effects of non-linearities within active region. The pulse stretcher may restore the laser pulse to the desired peak power.

Figure 1:
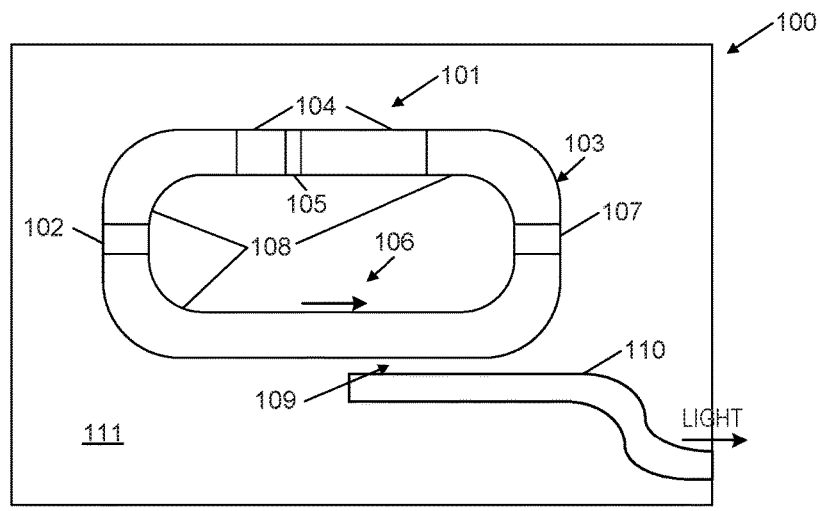
FIG. 1 illustrates an example semiconductor laser.

FIG. 1 illustrates an example semiconductor laser 100. For example, the laser 100 may be an on-chip semiconductor comb laser. That is, laser 100 may be a laser that produces a spectrum of light having a series of discrete, equally-spaced comblines. In various implementations, the laser 100 is a mode-locked laser. The laser 100 may include a traveling wave laser cavity 103 in which laser pulses travel around the cavity 103 in a direction of propagation 106 (counter-clockwise in the illustrated example). For example, the traveling wave laser cavity 103 may be racetrack shaped as illustrated (i.e., rectangular with curved corners). In other implementations, the cavity 103 may be any shape suitable for traveling waves, such as triangular, rectangular, or other polygonal shape with etched waveguide facets as reflectors at the corners, or ring, oval or other curved shapes.

The laser cavity may comprise a waveguide 108 connecting various components 102, 107, 101. In some implementations, the waveguide 108 may be an active waveguide. For example, the waveguide 108 may provide active amplification. In other implementations, the waveguide 108 may be a passive waveguide, such as a passive silicon waveguide. For example, the passive silicon waveguide 108 may comprise a rib waveguide comprising a strip or strips of silicon disposed on a silicon layer. As another example, the passive silicon waveguide 108 may comprise a strip waveguide comprising a strip of silicon disposed on a silicon oxide or other undercladding layer. In further implementations, other passive silicon waveguides 108 may be employed. The dimensions of the waveguide 108 may be determined according to the desired laser characteristics, such as comb width, center frequency, pulse width, outcoupling ratio, etc . . . .

The example laser 100 further includes an active section 101 of the laser cavity 103 coupled to the waveguide 108. The active section 101 may be defined as the portion of the laser cavity 103 that actively generates the light. The active section 101 may include a semiconductor optical amplifier (SOA) section 104 comprising a laser gain medium, and a saturable absorber (SA) 105. The laser gain medium may comprise quantum dots that are capable of generating a plurality of optical wavelengths. For example, the laser gain medium may be formed using various III-V semiconductor materials such as InAs, InGaAs, GaAs, InP, InGaP, InGaAsP, etc. . . . . In the illustrated example, the SA 105 comprises a section of the laser gain medium. Specifically, the SOA section 104 comprises a forward biased region of the laser gain medium and the SA section 105 comprises a reverse biased region of the laser gain medium. In the illustrated example, the SA 105 is disposed within the SOA 104 so that portions of the SOA 104 surround the SA 105. In other implementations, other configurations of the SA 105 and SOA 104 may be utilized. For example, the SA 105 may be at the rear or front of the active region. As another example, rather than a contiguous section of laser gain medium, the SOA 104 and SA 105 may comprise separate gain medium sections connected by waveguide 108. While the illustration is not to scale, the SOA 104 will generally be longer than the SA 105. For example, the SOA 104 may be between 5 and 20 times longer than SA 105.

The example laser 100 further comprises a laser output 110 coupled to the waveguide 108. For example, the laser output 110 may comprise a waveguide 110. In some implementations, the output waveguide 110 may be the same type of passive silicon waveguide as waveguide 108. In other implementations, the output waveguide 110 may of a different type. The example waveguide 110 is coupled to waveguide 108 via evanescent coupling by proximity in a coupling region 109. Each time a circulating pulse in the waveguide 108 passes the outcoupling region 109, a portion of the pulse is output by the laser output 110. The degree of outcoupling may be configured based on various design considerations, such as desired output pulse power, pulse power within the cavity 103, or desired comb width. In various implementations, the output laser pulse power may be between 20% and 80% of the cavity pulse power. For example, the output power may be approximately 50% of the cavity pulse power. Various parameters, such as length of the coupling region 109 and distance between the output waveguide 110 and the cavity waveguide 103 may be configured to provide the desire level of outcoupling.

The example laser 100 further comprises a pulse stretcher 107. The pulse stretcher 107 is embedded in the laser cavity 103. For example, the pulse stretcher may be coupled to the waveguide 108 after the laser output 110 (i.e., after the coupling region 109) and before the active section 101, where "before" and "after" are defined by the direction of propagation 106. The pulse stretcher 107 stretches laser pulses in the time domain before those pulses enter the active section 101. In some implementations, the pulse stretcher 107 may be a passive dispersive element coupled to the waveguide 108, such as a passive silicon dispersive element. For example, the pulse stretcher 107 may be a dispersion Bragg grating (DBG) waveguide, a horizontal slot waveguide, a photonic crystal waveguide, or other dispersive waveguide. The dispersive element may have engineered dispersion to provide the desired pulse stretching. Examples of the effects of the pulse stretcher on input pulses is described with respect to FIG. 5.

The pulse stretcher lowers peak laser pulse power within the active section 101. This may reduce the effects of various unwanted non-linearities that depend on peak power. For example, the stretcher 107 may reduce or avoid the effects of optical non-linearities such as four wave mixing, or Kerr lensing, or other non-linearities such as saturation of gain or thermal effects such as thermal lensing. The amount by which the pulse stretcher lowers peak laser pulse power may be a design parameter for the system. For example, pulse stretcher may lower peak laser pulse power to below a threshold for a non-linear behavior within the laser gain medium. The threshold may be for an unwanted non-linear behavior. For example, the threshold may be a peak power above which an unwanted non-linear behavior in the section 101 prevents stable operation. In other words, the threshold may be set to allow some desirable or acceptable non-linear behavior while avoiding or reducing the effects of other unwanted non-linear behaviors.

The example laser 100 further comprises a pulse compressor 102. The pulse compressor 102 is embedded in the laser cavity 103. For example, the pulse compressor 102 may be coupled to the waveguide 108 after the active section 101 and before the output 111. The pulse compressor 102 narrows the pulse that exits the active section 101 in the time domain. In some implementations, the pulse compressor 102 has an inverse dispersion profile compared to the stretcher 107. In other words, if the active section 101 wasn't present, the pulse exiting the compressor 102 would have the same shape and width as the pulse entering the stretcher 107. In other implementations, the compressor 102 has a dispersive profile that is not simply an inverse to the stretcher 107. For example, the compressor 102 may be used to compensate for non-linearities in the active section 101 that are not avoided by lowering peak power using the stretcher 107, to compensate for dispersion in the active section 101, or compensate for other effects within the cavity 103.

The pulse compressor 102 may be a passive dispersive element coupled to the waveguide 108, such as a passive silicon dispersive element. For example, the pulse compressor 102 may be dispersion Bragg grating (DBG) waveguide, a horizontal slot waveguide, a photonic crystal waveguide, or other dispersive waveguide. The dispersive element may have engineered dispersion to provide the desired pulse compression. Examples of the effects of the pulse compressor on input pulses is described with respect to FIG. 6. In some implementations, the pulse compressor 102 is the same type of passive silicon dispersive element as the pulse stretcher 107. For example, this may simplify the manufacturing process. In other implementations, the pulse compressor 102 is a different type of passive silicon dispersive element. For example, for a particular laser application, one type of element may provide better pulse compression and another type of element may provide better pulse stretching.

The pulse compressor raises peak power for pulses that pass through it. The output of the pulse compressor is a narrower (in time), higher-power pulse that provide the output pulse through the output 110 and the recirculated pulse that continues travelling around the cavity 103. In other words, in a given pulse circulation, the output of the stretcher is input for the outcoupling region 109. The output of the outcoupling region 109 is then the input to the pulse stretcher 107 for the next circulation.

In some implementations, the components 101-111 of the laser may be fully integrated on-chip. In these implementations, the example laser 100 may include a substrate 111, such as a silicon-on-insulator (SOI) substrate. For example, the passive silicon waveguide 103, the pulse stretcher 107, and the pulse compressor 102 may comprise silicon structures formed on an upper layer of the SOI substrate 111. As discussed above, the active section 101 may include III-V quantum dot materials. In some cases, this active section 101 may be bonded to the substrate 111. An example of such a configuration is described with respect to FIG. 4.

Figure 2:
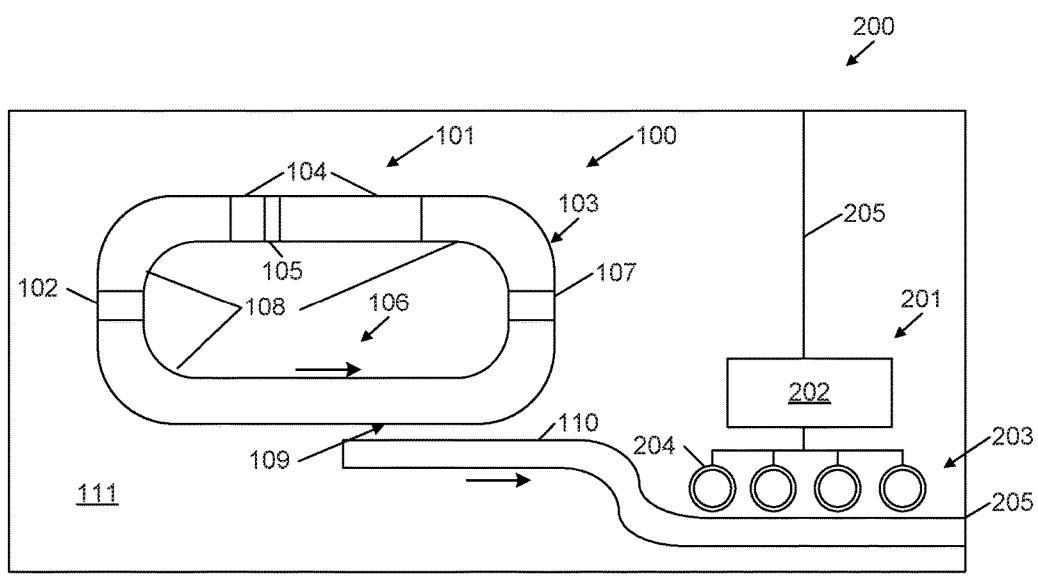
FIG. 2 illustrates an example optical transmitter.

FIG. 2 illustrates an example optical transmitter 200. For example, the transmitter 200 may be a fully integrated on-chip WDM electro-optical transmitter. For example, the transmitter 200 may be integrated onto a SOI substrate 111 as described with respect to FIG. 1. The transmitter 200 may include a semiconductor laser 100 as described with respect to FIG. 1. For example, the laser 100 may include a traveling wave laser cavity 103, an active section 104, a laser output waveguide 110, a pulse stretcher 107, and a pulse compressor 102.

The transmitter 200 further comprises a modulator 201. The modulator is coupled to the laser output 110 and modulates an electrical signal provided via signal input 205 onto the multi-wavelength laser signal provided by the output 110. For example, the modulator 201 may be integrated onto the substrate 111 through deposition, bonding, or a combination thereof.

In this example, the modulator 201 comprises a plurality 203 of ring resonators 204 coupled to the output waveguide 110 via evanescent coupling. Each resonator 204 is configured to resonate with and modulate one of the wavelengths of the comb laser. The modulation may be performed by driving tuning elements using driving circuit 202. These small variations may be used to modulate the individual wavelengths of the laser signal. The driving circuit 202 may receive an electrical signal via input 205 and translate the signal into a WDM signal. For example, the driving circuit 202 may drive thermal heating elements or semiconductor-based electrical tuning elements of the resonators 203. The transmitter further comprises an optical output 205 to output the modulated multi-wavelength laser signal. For example, the output 205 may be an optical connector to couple to an optical fiber for transmitting the signal off chip. As another example, the output 205 may be a continuation of the waveguide 110 for transmitting the signal on chip.

FIGS. 3A-3C illustrate top-down views of various passive silicon dispersive elements that may be used to implement pulse stretchers and pulse compressors.

FIG. 3A illustrates an example waveguide Bragg grating 301. In this example, a pulse enters at input 302 and exits at output 303 as a dispersed pulse (i.e., either lengthened or shortened in the time domain). For example, the input 302 and output 303 may be locations at in a cavity waveguide 108 where the element begins and ends. In other words, the input 302 and output 303 may be continuations with the same dimensions as the cavity waveguide 108. In other implementations, the input 302 and output 303 may be transitions or coupling locations between the waveguides 304 and 305 and the laser cavity waveguide 108. As discussed above, the grating 301 may be engineered to provide pulse stretching or pulse compression. The grating 301 comprises an input waveguide 304 evanescently coupled to an output waveguide 305. The input and output waveguides 304 and 305 comprise a plurality of sidewall grating structures 306, 307. Parameters such as spacing between the structures 306, 307, dimensions of the structures 306, 307, spacing between the waveguides 304, 305, and dimensions of the waveguides 304, 305 may all be engineered to provide the desired dispersive profile to implement a pulse stretcher or compressor.

FIG. 3B illustrates an example horizontal slot waveguide 310. In this example, a pulse enters at input 311 and exits at output 312. The example slot waveguide comprises two parallel waveguides 313 and 314 and a buried horizontal slot (not pictured) underneath the waveguides 313, 314. For example, the input 311 may include a 'Y' splitter to join the cavity waveguide 108 to the two waveguides 313, 314 and a 'Y' combiner to rejoin the waveguides 313, 314 to the cavity waveguide 108. Parameters such as dimensions of the waveguides 314, 313, and the horizontal slit, spacing between the waveguides 314, 313 and slit, and length of the waveguide 310 may be engineered to provide the desired dispersive profile to implement a pulse stretcher or compressor.

FIG. 3C illustrates an example photonic crystal waveguide 320. In the example, a pulse enters at input 321 and exits at output 322. The example photonic crystal waveguide 320 comprises a waveguide material having sets 323, 324 of photonic crystals 313 on either side of a central waveguide portion 325. For example, the photonics crystals 313 may comprise holes etched into the waveguide material. In various implementations, parameters such as the number of crystals 313, the arrangement of sets 323, 324, the spacing between crystals 313, the spacing between sets 323, 324, and the composition or size of the crystals 313 may be engineered to provide the desired dispersive profile to implement a pulse stretcher or compressor.

FIG. 4 illustrates an example portion 400 of an active section of a laser. For example, the portion 400 may be implemented as an SOA, such as SOA 104 of FIG. 1. As another example, portion 400 may be implemented as an SA, such as SA 105 of FIG. 1.

Portion 400 includes a bulk silicon substrate 401, and a buried oxide (BOX) layer 402. For example, the BOX layer 402 may comprise a layer of silicon dioxide formed on the silicon layer 401. A silicon waveguide 403 is formed on the BOX layer 402. For example, the waveguide 403 may be deposited on the BOX layer 402 or etched into an upper silicon layer of a silicon substrate. In some implementations, the waveguide 403 has the same dimensions as the passive silicon waveguide of the laser cavity passive waveguide (e.g., waveguide 108 of FIG. 1). In other implementations, the waveguide 403 has different dimensions, and the active section may include transition regions at its beginning and end to transition between the passive waveguide and the active section waveguide.

The portion 400 further includes an active device bonded to the waveguide 403. For example, the portion 400 may include a bonding layer 404. The bonding layer 404 may include various interlayers for device functionality. For example, the bonding layer 404 may include a superlattice layer to provide crystal structure matching between the silicon waveguide 403 and the III-V gain material. As another example, the bonding layer 404 may include a cladding layer and a contact layer to allow the electrical contacts 405 to be deposited onto the device.

The portion further comprises a III-V gain medium 406. For example, the laser gain medium may be formed using various III-V semiconductor materials such as InAs, InGaAs, GaAs, InP, InGaP, InGaAsP, etc. . . . . As discussed above, the medium 406 may comprise quantum dots composed of the III-V material. A contact and cladding layer 407 is disposed on the medium 406 and a first electrical contract 408 is disposed on the contact/cladding layer 407. A pair of second contacts 405 are disposed on the bonding layer 404. To implement the SOA, a forward bias voltage is applied across the contact 408 and contacts 405. To implement the SA, a reverse bias voltage is applied across the contact 408 and the contacts 405.

Figure 5:
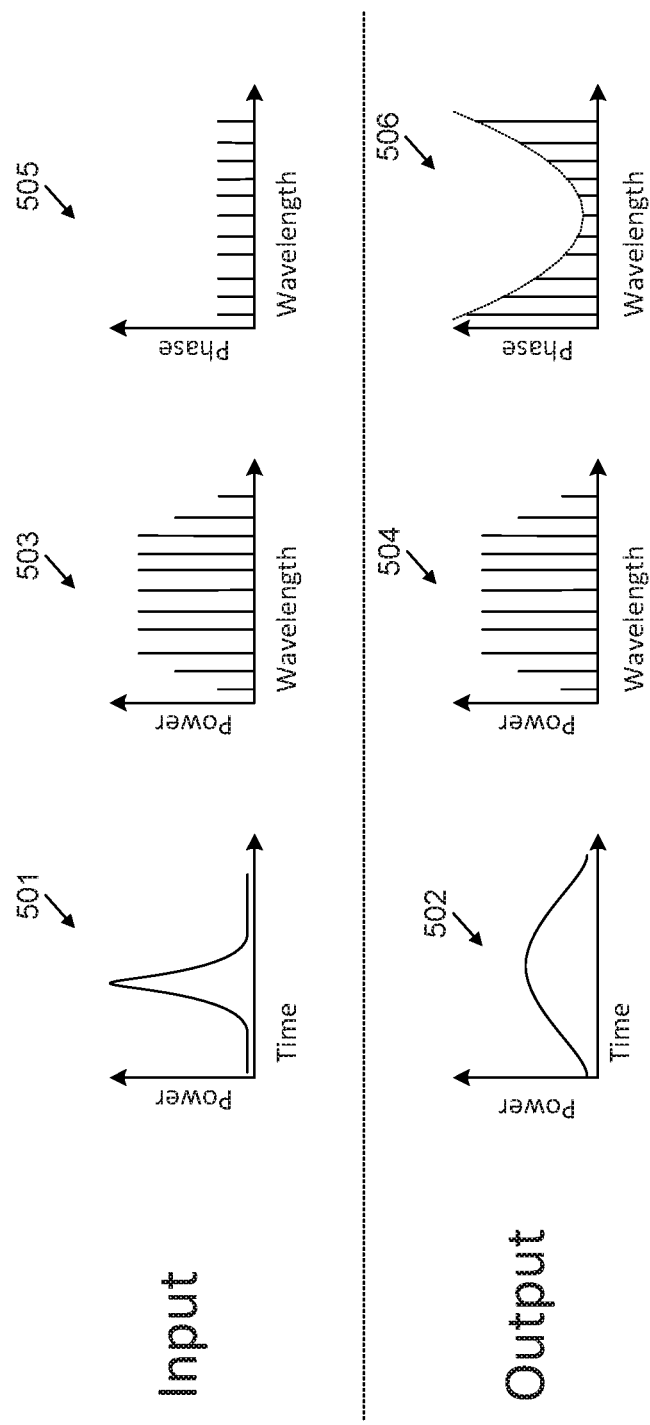
FIG. 5 illustrates example effects of a pulse stretcher on an optical pulse.

FIG. 5 illustrates example effects of a pulse stretcher on an optical pulse. For example, the pulse stretcher 107 of FIGS. 1 and 2 may operate as illustrated in FIG. 5.

Graphs 501 and 502 illustrate the effect of the stretcher on power in the time domain. As illustrated, the stretcher reduces the peak pulse power by widening the pulse in the time domain. In the illustrated implementation, the total power (i.e., the area under the curve) does not change. In other implementations, there may be some power loss within the pulse stretcher.

As illustrated in graphs 503 and 504, the laser pulse of the comb laser comprises a plurality of discrete wavelengths, with each wavelength having a particular power. In this implementation, the stretcher does not change the power-per-wavelength.

As illustrated in graphs 505 and 506, the stretcher lengthens the pulse by changing the phase of each wavelength. For example, the stretcher may change the phase from a constant phase per wavelength to a parabolic wavelength to phase profile. In general, the pulse stretcher may introduce dispersion such the pulse is not transform limited such that the phase difference between a line and its neighbors is not constant (i.e., $\phi_n - \phi_{n+1} \neq$ constant).

Figure 6:
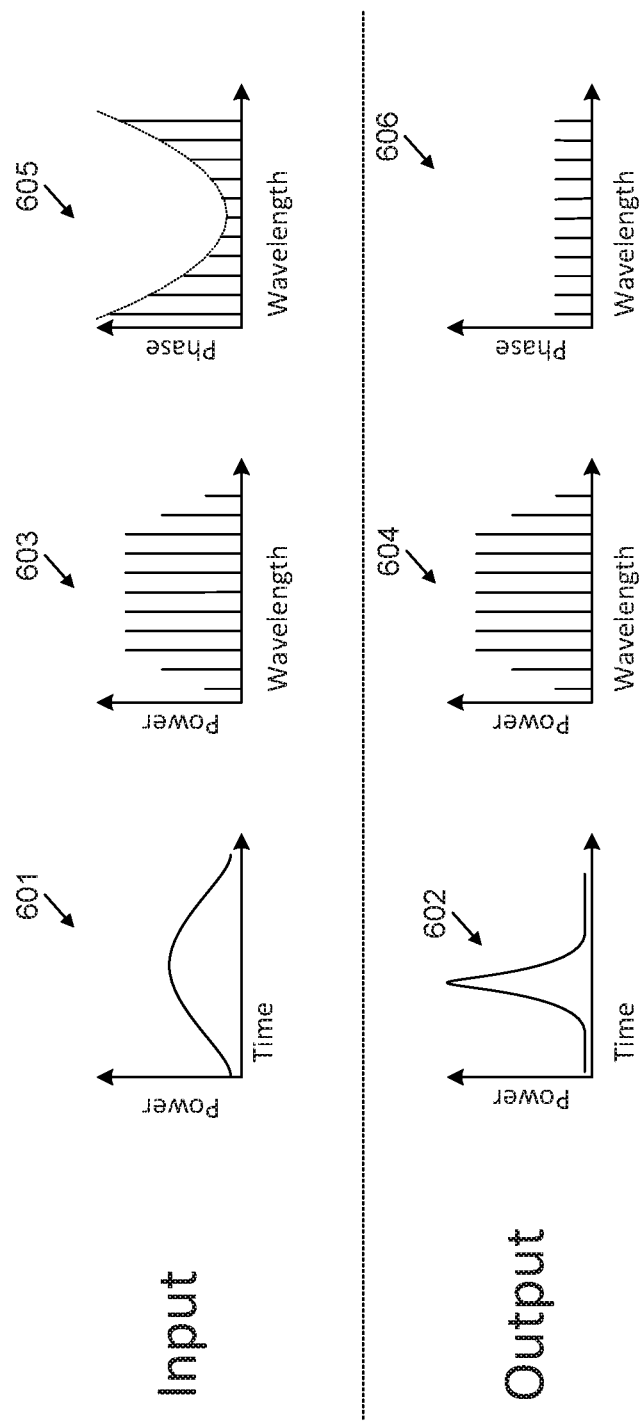
FIG. 6 illustrates example effects of a pulse compressor on an optical pulse.

FIG. 6 illustrates example effects of a pulse compressor on an optical pulse. For example, the pulse compressor 102 of FIGS. 1 and 2 may operate as illustrated in FIG. 6.

As illustrated in graphs 601 and 602, the pulse compressor takes the broad pulse and restores the narrow pulse, raising peak power of the pulse. Similar to the pulse stretcher, the pulse compressor does not change the power per wavelength (graphs 603 and 604). The pulse compressor operates on the non-transform limited pulse and restores it to a transform limited state such that the phase difference between a line and its neighbors is constant (i.e., $\phi_n - \phi_{n+1} =$ constant). For example, as illustrated in graphs 605 and 606, the compressor may a pulse with a parabolic phase to wavelength profile and restore it to a constant phase to wavelength profile.

Figure 7:
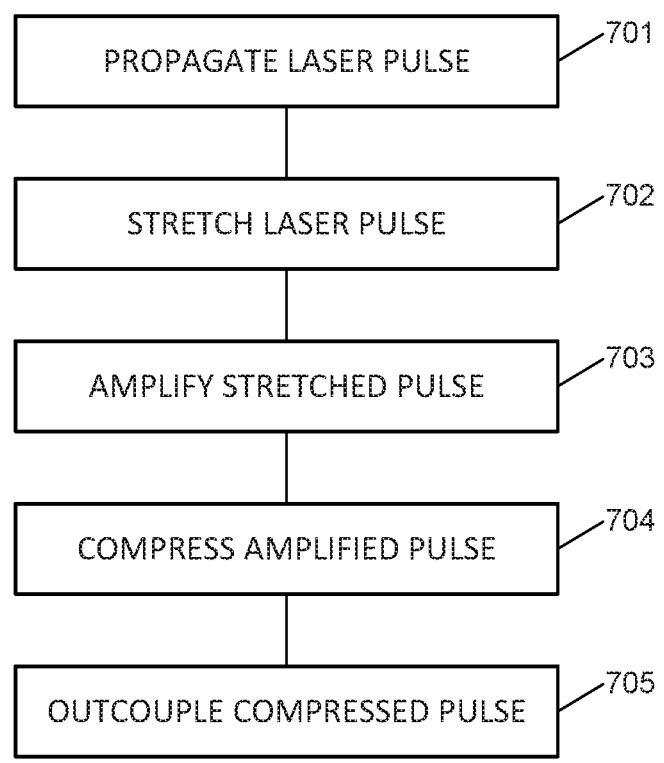
FIG. 7 illustrates an example method of operating a laser.

FIG. 7 illustrates an example method of operating a laser. For example, the multi-wavelength semiconductor laser 100 described with respect to FIGS. 1 and 2 may be operated as illustrated.

The example method includes block 701. Block 701 includes propagating a laser pulse within a traveling wave laser cavity comprising a passive silicon waveguide. For example, block 701 may comprise propagating a multi-wavelength comb laser pulse within a traveling wave laser cavity 103 as described with respect to FIGS. 1 and 2.

The example method further includes block 702. Block 702 includes stretching the laser pulse in the time domain to produce a stretched laser pulse having a lower peak power than the laser pulse. For example, block 702 may be performed by passing the pulse through a passive silicon dispersive element coupled to the passive silicon waveguide. As described with respect to FIGS. 1 and 2, block 702 may be performed on pulses after they have been out coupled and before they enter an active section of the laser cavity.

The example method further includes block 703. Block 703 includes amplifying the stretched laser pulse in an active section of the traveling wave laser cavity. For example, block 703 may comprise amplifying a stretched pulse within an active section 101 of a laser 100 as described with respect to FIGS. 1 and 2.

The example method further includes block 704. Block 704 includes compressing the amplified laser pulse in the time domain to produce a compressed laser pulse having a higher peak power than the amplified stretched laser pulse. For example, block 704 may be performed by passing the pulse through a second passive silicon dispersive element coupled to the passive silicon waveguide. For example, block 704 may be performed on pulses after they exit the active section 101 and before an outcoupling region 109 in a laser 100 as described with respect to FIGS. 1 and 2.

The example method further includes block 705. Block 705 includes outcoupling the compressed laser pulse to produce an output laser pulse. For example, block 705 may be implemented as described with respect to the operation of the output waveguide 110 and outcoupling region 109 of FIGS. 1 and 2. The portion of the compressed waveguide not out coupled may then be recirculated as the input to block 701.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

The invention claimed is:

1. A semiconductor laser, comprising:
a traveling wave laser cavity;
an active section coupled to a waveguide, the active section comprising a forward biased laser gain medium region and a saturable absorber comprising a reverse biased laser gain medium region; wherein the forward biased laser gain medium region is between 5 and 20 times longer than the reverse biased laser gain medium region;
a laser output from the active section coupled to the waveguide;
a pulse stretcher embedded m the traveling wave laser cavity; and
a pulse compressor embedded in the traveling wave laser cavity;
wherein, the traveling, wave laser cavity has a direction of propagation the pulse stretcher is coupled to the waveguide after the laser output and before the active section, in the direction of propagation; and the pulse compressor is coupled to the waveguide after the active section and before the laser output, in the direction of propagation.

2. The laser of claim 1, wherein the pulse stretcher comprises a passive dispersive element.

3. The laser of claim 2, wherein the passive dispersive element comprises a waveguide Bragg grating, a horizontal slot waveguide, or a photonic crystal waveguide.

4. The laser of claim 1, wherein the pulse compressor comprises a passive dispersive element.

5. The laser of claim 4, wherein the passive dispersive element comprises a waveguide Bragg grating, a horizontal slot waveguide, or a photonic crystal waveguide.

6. The laser of claim 1, wherein the pulse stretcher lowers peak laser pulse power within the active section.

7. The laser of claim 6, wherein the pulse stretcher lowers peak laser pulse power to below a threshold for non-linear behavior within the laser gain medium.

8. The laser of claim 1, wherein an output of the pulse stretcher has a parabolic phase to wavelength profile.

9. The laser of claim 1, wherein the output of the pulse compressor has a constant wavelength to phase profile.

10. The laser of claim 1, further comprising a silicon-on-insulator (SOI) substrate, wherein the passive silicon waveguide, the pulse stretcher, and the pulse compressor comprise silicon structures formed on an upper layer of the SOI substrate, and the active section comprises a III-V quantum dot material bonded to the substrate.

11. The laser of claim 1, wherein the laser gain medium comprises a forward biased quantum dot medium, and the saturable absorber comprises a reverse biased quantum dot medium.

12. An optical transmitter, comprising: a semiconductor laser comprising:
a traveling wave laser cavity having a direction of propagation and comprising a passive silicon waveguide;
an active section coupled to the passive silicon waveguide, the active section comprising a forward biased laser gain medium and a saturable absorber comprising a reverse biased laser gain medium region, wherein the forward biased laser gain medium region is between 5 and 20 times longer than the reverse biased laser gain medium region;
a laser output waveguide coupled to the cavity waveguide to output a multi-wavelength laser signal;
a pulse stretcher embedded in the passive silicon waveguide after the laser output and before the active section, in the direction of propagation; and a pulse compressor embedded in the passive silicon waveguide after the active section and before the laser output, in the direction of propagation;
a modulator coupled to the laser output to modulate an electrical signal onto a multi-wavelength laser signal; and
an optical output to output the modulated multi-wavelength laser signal.

13. The transmitter of claim 12, wherein the pulse stretcher comprises a first passive silicon dispersive element, and the pulse compressor comprises a second passive silicon dispersive element.

14. The transmitter of claim 13, wherein the first passive silicon element and the second passive element comprise waveguide Bragg gratings, horizontal slot waveguides, or photonic crystal waveguides.

15. The transmitter of claim 12, further comprising: a silicon-on-insulator (SOI) substrate, wherein:
the passive silicon cavity waveguide, the pulse stretcher, the pulse compressor, and the output waveguide comprise silicon structures formed on an upper layer of the SOI substrate,
the active section comprises a III-V quantum dot material bonded to the substrate, and
the modulator comprises a plurality of ring resonators disposed on the substrate.

16. The transmitter of claim 12, wherein the pulse stretcher lowers peak laser pulse power to below a threshold for non-linear behavior within the laser gain medium.

17. A method, comprising:
propagating a laser pulse within a traveling wave laser cavity comprising a waveguide;
stretching the laser pulse in using a pulse stretcher in a time domain to produce a stretched laser pulse having a lower peak power than the laser pulse;
amplifying the stretched laser pulse in an active section comprising a laser gain medium and a saturable absorber of the traveling wave laser cavity, where the laser gain medium between 5 and 20 times longer than the saturable absorber;
compressing the amplified stretched laser pulse in the time domain to produce a compressed laser pulse having a higher peak power than the amplified stretched laser pulse; and
outcoupling the compressed laser pulse to produce an output laser pulse.

18. The method of claim 17, further comprising stretching the laser pulse in the time domain by passing the pulse through a passive silicon dispersive element coupled to the passive silicon waveguide.

19. The method of claim 18, further comprising compressing the amplified laser pulse in the time domain by passing the pulse through a second passive silicon dispersive element coupled to the passive silicon waveguide.

\* \* \* \* \*